United States Patent [19]
Patni

[11] Patent Number: 4,950,930
[45] Date of Patent: Aug. 21, 1990

[54] BRIDGE BASE CONTROL CIRCUIT WITH CONTROLLED BLOCKING EVEN IN THE AVALANCHE MODE

[75] Inventor: Chandra K. Patni, London, United Kingdom

[73] Assignee: SGS-Thomson Microelectronics S.A., Gentilly, France

[21] Appl. No.: 222,433

[22] Filed: Jul. 19, 1988

[30] Foreign Application Priority Data

Jul. 21, 1987 [FR] France ............... 87 10605

[51] Int. Cl.$^5$ ................ H03K 17/60; H03K 17/687; H03K 3/01; G05F 1/40
[52] U.S. Cl. ..................... 307/570; 307/571; 307/576; 307/579; 307/585; 307/270; 307/257; 307/315; 323/289
[58] Field of Search ............ 307/570, 571, 576, 585, 307/270, 315, 257, 241, 242, 253, 254; 361/152; 323/289

[56] References Cited

U.S. PATENT DOCUMENTS

| 3,400,304 | 9/1968 | Ziegler | 361/152 |
| 3,678,291 | 7/1972 | Coe | 307/315 |
| 4,454,454 | 6/1984 | Valentine | 307/270 |
| 4,540,899 | 9/1985 | Pelly | 307/270 |
| 4,541,389 | 9/1985 | Kosak et al. | 361/152 |

FOREIGN PATENT DOCUMENTS

| 2542948 | 9/1984 | France . | |
| 0009130 | 1/1982 | Japan | 307/270 |
| 0508883 | 5/1976 | U.S.S.R. | 307/270 |

Primary Examiner—Andrew J. James
Assistant Examiner—Trong Quang Phan
Attorney, Agent, or Firm—Lowe, Price, LeBlanc, Becker & Shur

[57] ABSTRACT

A bridge base control circuit for a power switch. At the switching off, the base is connected with a reference terminal (M) through a first switching means (T2) having a low impedance and the emitter is connected with a supply terminal (Vcc) through a second switching means for allowing the reverse current to flow through the base-emitter junction. The second switching means has a low impedance as long as the voltage $V_{BE}$ is low, immediately after its switching on and that of the first switching means, and a high impedance (R1) as soon as the emitter voltage is approaching the supply voltage (VCC), this transition being automatically carried out.

15 Claims, 3 Drawing Sheets

BRIDGE BASE CONTROL CIRCUIT WITH CONTROLLED BLOCKING EVEN IN THE AVALANCHE MODE

BACKGROUND OF THE INVENTION

The instant invention relates to the base control of power switches such as, for example, power transistors, Darlington-transistors or cascode-transistors.

The instant invention relates more particularly to a bridge base control circuit such as disclosed in the French patent application 2,542,948, This type of circuit allows a current to flow through the base of the power transistor when one wishes it to be conductive, then, at the switching off of the power transistor, to extract a base current (negative base current in case of a NPN transistor) until the charges stored in this transistor are extracted.

An advantage of the bridge circuits is that it is possible to obtain this result with a single polarity voltage source.

FIG. 1 shows an examplary conventional circuit of a bridge base control. A switch power transistor Tp comprises a base terminal B, an emitter terminal E, and a collector terminal C. A switching bridge comprises four switches T1 to T4 connected between a supply terminal Vcc and a reference terminal M. More particularly, switch T1 is connected between voltage Vcc and the base terminal B, switch T2 is connected between its base terminal B and the reference terminal M, switch T3 is connected between the supply terminal Vcc and the emitter terminal E, and switch T4 is connected between terminal E and the reference terminal M.

Thus, in a first state, switches T2 and T3 are OFF and switches T1 and T4 are ON and a base curent supplied by a current source IB1 flows from the supply voltage Vcc toward terminal B, terminal E and reference terminal M through the ON switches T1 and T4 according to the current path shown by the arrows drawn in solid lines.

At the switching off, switches T1 and T4 are OFF and switches T3 and T2 are ON. Thus, a reverse current flows from supply terminal Vcc through switch T3, terminal E, terminal B, switch T2, toward reference terminal M.

As stated for example, on page 99, in the book published by Société THOMSON CSF in 1983, entitled "Power transistor in energy conversion", a drawback of this type of base current extracting circuit to which, at the switching off, a reverse voltage is applied between the emitter and the base is that, if voltage Vcc is too high, once the charges stored near the emitter-base junction have been extracted, the emitter-base junction may break down in internal avalanche. As a result, a substantial current is dissipated in the control circuit. Various methods have already been proposed for reducing this drawback, but none can eliminate this drawback in a satisfactory or simple way.

SUMMARY OF THE INVENTION

Therefore, an object of the instant invention is to eliminate internal avalanche breakdown of the emitter-base junction at switching off of a power transistor.

Another object of the instant invention is to provide for a bridge base control circuit in which the conduction of the main transistor is ensured in accordance with the switch mode.

Another object of the instant invention is to provide for a bridge base control circuit having a very low energy consumption.

Another object of the instant invention is to provide for a bridge base control circuit in which various protections are provided for ensuring a safe and reliable operation of the system.

These objects and others of the invention are attained by providing for a bridge base control circuit for a power switch wherein, at the switching off, the base is connected with a reference terminal by a first switching means with a low impedance and the emitter is connected with a supply terminal by a second switching means for permitting the flow of a reverse current through the base-emitter junction, and wherein the second switching means has a low impedance as long as the emitter voltage is low, immediately after its switching on and that of the first switching means, and a higher impedance as soon as the emitter voltage is approaching the supply voltage, this transition being automatically carried out.

According to an embodiment of the instant invention, the second switching means comprises, on the one hand, a main switch which becomes conductive when the voltage difference between its first main terminal and its control terminal is higher than a predetermined threshold, this first main terminal being connected with the supply terminal and the second main terminal being connected with the emitter terminal and, on the other hand, with an auxiliary switch connected between the control terminal and the second main terminal, and a resistor connected between the control terminal and the first main terminal.

According to an embodiment of the instant invention, the main and auxiliary switches are depletion MOS transistors of the P-channel type.

According to another embodiment of the instant invention, the main and auxiliary switches are PNP bipolar transistors.

According to a further embodiment of the instant invention, the bridge leg ensuring the supply of the base current for switching on the power switch is of the switched current source-type, comprising a controlled switch in series with an inductance.

According to yet another embodiment of the instant invention, the control circuit comprises a triggering control source provided with inhibition means when the power switch is not operating properly.

Therefore, according to the invention, at the switching off, as soon as the emitter is destocked and its voltage rises with respect to the base which is grounded, a current limitation resistor is automatically introduced into the circuit so that the avalanche effect is stopped or, at least, the avalanche current is limited to a low value.

BRIEF DESCRIPTION OF THE DRAWINGS

Other advantages and features of the instant invention will clearly appear from the following detailed description of preferred embodiments, in connection with the attached drawings, wherein.

Figure 1:
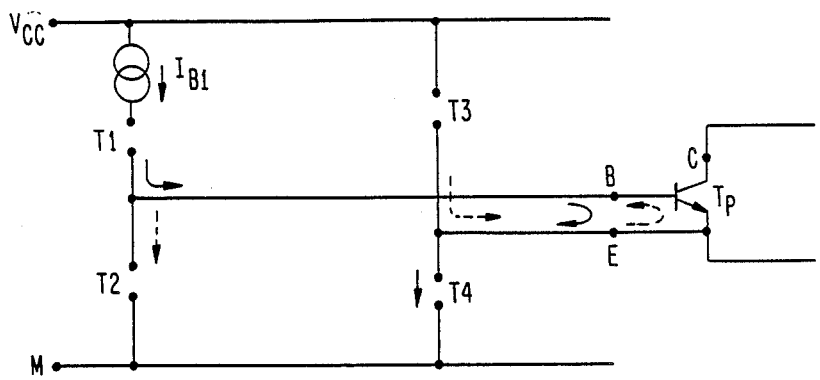
FIG. 1, hereinabove disclosed, shows a bridge base control circuit according to prior art.

As disclosed in relation with FIG. 1 when one wishes to switch off the bridge base control circuit, switches T1 and T4 are open and switches T2 and T3 are closed.

Figure 2:
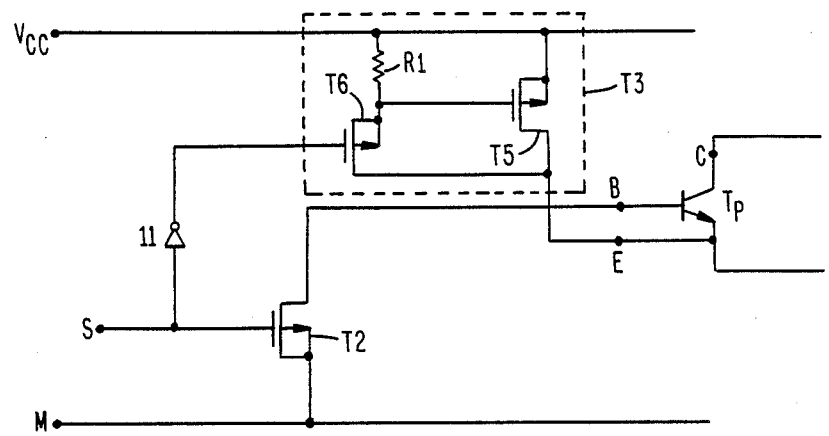
FIG. 2 shows the bridge circuit legs according to the invention ensuring the current flow during the switching off.

FIG. 2 shows an embodiment wherein the switching off order has been given and it shows the only bridge legs which allow the current to flow, that is, the legs comprising switches T3 and T2.

Switch T2 is a N-channel MOS transistor.

Switch T3 comprises two P-channel MOS transistors T5 and T6 and a resistor R1 having, for example, a value equal to 1 KΩ. The source of transistor T5 is connected with the supply terminal Vcc, the drain of transistor T5 is connected with the emitter terminal E and the gate of transistor T5 is connected with a first terminal of resistor R1 and with the source of transistor T6. The other terminal of resistor R1 is connected with the supply terminal Vcc, that is, with the source of transistor T5. The drain of transistor T6 is connected with the drain of transistor T5 at the terminal of emitter E and the gate of transistor T6 receives a switching off order signal S for the power transistor Tp through an inverter I1, this order signal S being directly applied to the gate of the N channel transistor T2.

Thus, as soon as the signal S is applied for controlling the switching off of the power transistor Tp, switches T1 and T4 (not shown in FIG. 2) are immediately open and transistors T2 and T6 become conductive. The conduction of transistor T6 generates the conduction of transistor T5. A current thus flows between the supply terminal Vcc and the ground terminal M through transistor T5, the reverse-biased emitter-base junction of power transistor Tp and transistor T2.

During the first phase, the base terminal B is substantially at the ground voltage and, due to the stored charges, the emitter terminal E is at a voltage level nearly equal to the voltage of the base, for example at a voltage of about 1.5 volts. This voltage on terminal E also appears, through transistor T6, on the gate of transistor T5. This transistor is therefore conductive since the voltage on its source (Vcc) is clearly higher than the voltage on its gate (a few volts).

Then, while the charges stored in the base start to be extracted, the voltage on the emitter terminal E rises with respect to the voltage on the base and this voltage tends to approach Vcc. A P-channel MOS transistor, such as transistor T5, stops being conductive when the voltage difference between its source and its gate becomes lower than a given threshold. Therefore, when transistor Tp starts to be blocked and that its emitter voltage increases, transistor T5 is blocked. But, on the other hand, transistor T6 remains conductive and therefore the supply of the voltage onto terminal E is maintained through the connection toward terminal Vcc ensured by the transistor T6 and the current limitation resistor R1. An advantage of this structure is to allow, if transistor T5 has remained conductive and if the voltage Vcc is higher than the emitter-base avalanche voltage of power transistor Tp, for an avalanching of the emitter-base junction of said transistor Tp. An important amount of current would therefore be dissipated in the base control circuit.

Due to the disclosed structure of switch T3, as soon as the power transistor is blocked, resistor R1 is serially connected with the emitter-base junction and therefore, if an avalanche occurs, the avalanche current is extremely limited.

The circuit of FIG. 2 has been shown in relation with a preferred embodiment to clearly illustrate the operation of the invention. It is however apparent that other components having the same functions could be used. For example, transistors T5 and T6 instead of being P-channel MOS transistors could be PNP bipolar transistors. On the other hand, only a power transistor of the NPN-type has been considered, as it is the most usual case. However, if a PNP transistor is to be controlled, it would be sufficient to accordingly modify the supply voltages and the types of the various transistors.

Figure 3:
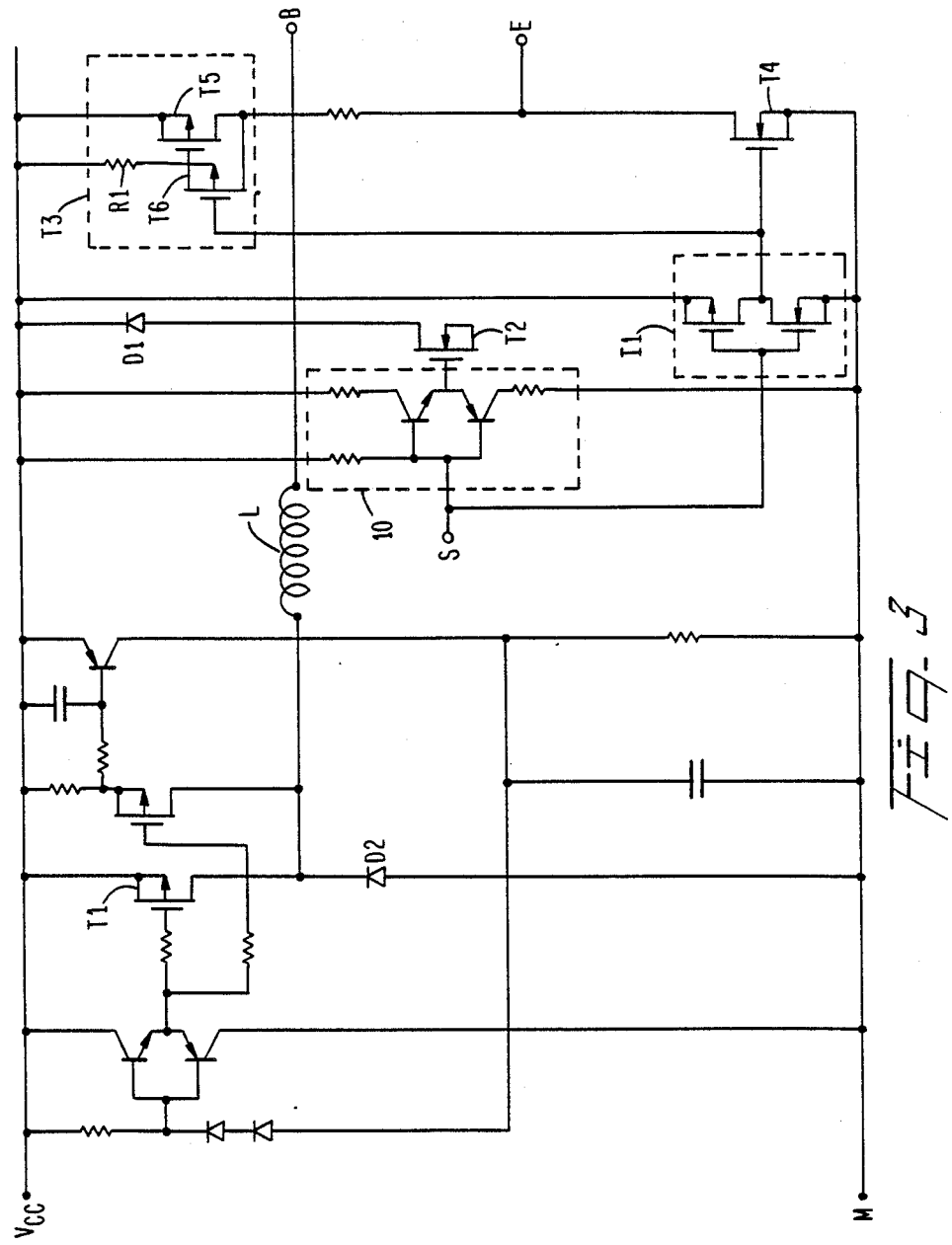
FIG. 3 shows an embodiment of the bridge base control circuit according to the invention.

FIG. 3 shows the general structure of an embodiment of the bridge base control circuit according to the invention, wherein further improvements have been made as compared to those shown in FIG. 2. In FIG. 3, supply terminals Vcc and M are shown again, as well as switches T1, T2, T3 and T4 shown in FIG. 1, and components T5, T6, R1 and I1 disclosed in relation with FIG. 2.

In the circuit shown in FIG. 3, one has used for the current source IB1, symbolically shown in FIG. 1 in the leg T1, a system commonly called switch-mode, that is, a pulse-operated system, which presents the advantage by permitting a substantial decrease of the consumption of the base control circuit and to be easily adjustable. The particular application of this switch-mode bridge circuit constitutes one of the embodiments of the instant invention.

Thus, leg 1 of the bridge, connected between the supply terminal Vcc and the base terminal B, comprises a N-channel MOS transistor T1 in series with an inductance L. A first diode D1 is connected between terminal B and the supply terminal Vcc and a second diode D2 is connected between the reference terminal M and the connection point of transistor T1 and inductance L. Transistor T1 operates as a high frequency switch, inductance L, in relation with diodes D1 and D2, supplying a smoothed current to the base terminal B when transistor Tp is in the ON state and when switch T4, constituted by a N-channel MOS transistor, is in the ON state.

It will be noted that the bridge circuit according to FIG. 3 permits obtaining OFF and ON switchings by acting only upon switches T2, T3 and T4, transistor T1 being still controlled at a high frequency, the current paths being formed through diodes D1 and D2. This constitutes an advantage of the instant invention since the necessary base current for obtaining the conduction of transistor Tp is available at any moment.

Inverter I1 is conventionally constituted by two complementary MOS transistors, the gates and drains of which are respectively interconnected.

At the input of transistor T2 (N-channel MOS transistor), a buffer stage 10 comprises bipolar transistors, NPN and PNP respectively, connected by their bases and by their emitters, respectively, assciated to suitable biasing resistors.

In relation with transistor T1, an exemplary oscillating circuit is shown. This circuit will not be disclosed here in greater detail since it will be easily understood by those skilled in the art. It is shown only to illustrate that its implementation is compatible with the manufacturing technologies of the other components. Indeed, all the components shown in FIG. 3, with the exception of inductance L, can be carried out on a single integrated circuit chip by using a technology permitting simultaneously integrating complementary MOS transistors and bipolar transistors of various types.

Figure 4:
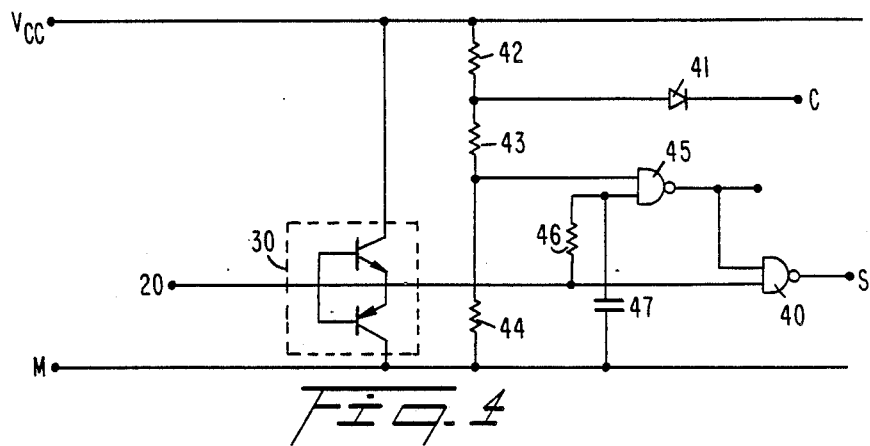
FIG. 4 shows an embodiment of the logic signal for providing the switching order signal to the base control circuit shown in FIG. 3.

As it can be seen in FIG. 3, the switching state of switches T2, T3 and T4 depends upon the external signal S. Means for supplying this signal are shown in FIG. 4. The circuit shown in FIG. 4 permits to transforming an incoming logic signal 20 into a signal S while ensuring certain protections for the circuit. The high or low level signal 20 is first sent to a buffer circuit 30, the output of which is connected with a first input of a NAND gate 40. The NAND gate 40 normally transmits a signal S reverse to signal 20. The other input of this NAND gate 40 ensures protection, that is, interrupts the supply of the base control signal of the main transistor if the latter proves to be faulty, and more particularly if the collector voltage is not at a low level soon after the switching on order. To achieve this purpose, the voltage on the collector terminal C is detected by a diode 41 connected with series resistors 42, 43 and 44, as shown. By way of example, resistors 42, 43 and 44 may have respective values of 10, 22 and 56 KΩ. The information relative to the voltage level of collector C, that is, the voltage at the connection point of resistors 42 and 43, is transmitted to a first input of a second NAND gate 45 connected between resistors 43 and 44. The other input of the second NAND gate 45 is connected with terminal 20 through a resistor 46 and is connected with terminal M through a cpacitor 47. Thus, the signal on terminal 20 is transmitted to the second input of the NAND gate 45 with a given delay inherent to the time constant of the RC circuit 46, 47. The output of gate 45 is transmitted to the second input of gate 40.

This logic circuit operates as follows. At the initial state, when a switching on order is sent to gate 20, the NAND gate 40 is enabled and the signal S is applied to the base control circuit. Then, with a time delay inherent to the abovementioned RC circuit 46, 47 time constant, the NAND gate 45 is enabled for admitting the high voltage information on collector C if this state appears, that is, if the circuit proves faulty. Then, in this case, gate 40 is invalidated, the signal S is no longer supplied and the conduction of switches T1, T2, T3, T4 is inverted. It will be understood that the time delay ensured by the RC circuit 46, 47 is designed to let time for the collector voltage immediately drop after the supply of the switching on order.

It will be noted that the signal at the output of gate 45 can be used as a status signal indicating the conduction or non-conduction status of the power transistor Tp.

In practice, the circuit shown in FIG. 4 can be integrated as a single semiconductor component with the various components of the base control circuit shown in FIG. 3.

Of course, the circuits shown in FIGS. 3 and 4 are only preferred embodiments of the instant invention. It concerns a coherent set of components permitting integration. However, it will be noted that other types of components could be used; for example, the MOS transistors could be replaced by bipolar transistors inasmuch as those transistors have a fast switching ability and a satisfactory resistivity in the OFF and ON states.

Figure 5:
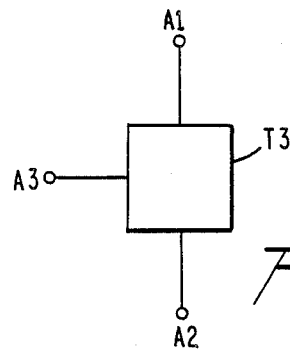
FIG. 5 shows a general drawing of switching means used for the implementation of the instant invention.

On the other hand, a particular application of switch T3 according to the instant invention is shown in FIGS. 2 and 3. More generally, as shown in FIG. 5, switch T3 may be considered as a tripole comprising two main terminals A1 and A2 and one control terminal A3.

Figure 6:
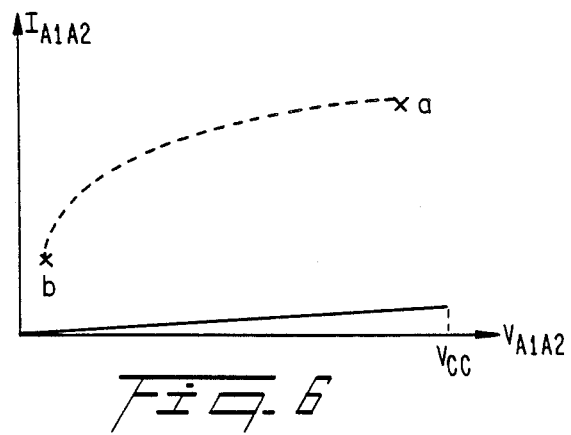
FIG. 6 shows characteristic curves of the switching means shown in FIG. 5.

This tripole presents the electrical characteristic illustrated in FIG. 6.

First, when the control signal applied on terminal A3 is in the OFF state, switch T3 is in the blocked state as shown by the lower curve drawn in solid lines in FIG. 6. Thus, when voltage $V_{A1A2}$ between those terminals A1 and A2 increases, the current $I_{A1A2}$ flowing through this switch remains substantially null (the slope of the straight line drawn in solid lines is exaggerated on the figure).

But, when the signal on the control terminal A3 is in the ON state, said switch has two main operating points. At point a, when the voltage between the main terminals A1 and A2, $V_{A1A2}$, is high, the switching means is in a low impedance state and allows a high current to flow at an optimized value for the destocking of transistor Tp whereas the voltage $V_{BE}$ of transistor Tp is low. At point a, the voltage $V_{A1A2}$ may be chosen at random, even at a value higher than the avalanche voltage of the base-emitter junction of the main transistor Tp.

At point b, when the voltage $V_{A1A2}$ is low, the second switching means T3 limits the current $I_{A1A2}$ to a value sufficiently low in order to limit the energy dissipated in the base-emitter junction of transistor Tp, even in the avalanche mode of the latter, to a non-destructive value for said transistor Tp. It will be understood that FIG. 6 is drawn at a logarithmic scale, the impedance being higher at point b than at point a. The transition between points a and b may be made according to any characteristic curve, for example as the one shown in FIG. 6, drawn in dotted lines.

I claim:

1. A bridge base control circuit means for controlling a power switch having a base and an emitter (Tp), wherein, at switching off, the base of said power switch being connected with a reference terminal (M) through a first switching means (T2) having a low impedance and the emitter of said power switch being connected with a supply terminal (Vcc) through a second switching means (T3) for allowing the flow of a reverse current in the base-emitter junction, and wherein the second switching means includes first circuit means for providing a low impedance immediately after switching on of said first and secon switching means when the base-emitter voltage ($V_{BE}$) is low due to stored change in said power switch, and wherein said second switching means includes second circuit means for providing a higher impedance relative to said low impedance as the emitter voltage approaches the supply voltage (Vcc) due to dissipation of said stored charge.

2. A base control circuit according to claim 1, wherein a bridge leg means of said bridge control circuit is provided ensuring the supply of the base current for the switching on of the power switch wherein said bridge leg means is of the switching current source type, comprising a switch (T1) controlled by a high frequency signal.

3. A base control circuit according to claim 2, wherein the bridge leg connected between the supply terminal (Vcc) and the base (B) of the power switch comprises:
 a P-channel field effect transistor (T1) controlled by an oscillating signal, in series with an inductance (L);

a first diode (D1) connected between the inductance terminal coupled with the base terminal (B) and the supply voltage (Vcc); and a second diode (D2) connected with the other inductance terminal coupled with said field effect transistor (T1) and the reference voltage (M).

4. A base control circuit according to claim 1, comprising a source of control signals provided with inhibition means acting when the power switch operation proves to be faulty.

5. A base control circuit according to claim 4, wherein said inhibition means is responsive to a collector voltage of said power switch and interrupts application of a control signal to said power switch when a predetermined change in said collector voltage does not occur within a predetermined period after application of said control signal.

6. A bridge base control circuit for a power switch (Tp), wherein, at the switching off, the base is connected with a reference terminal (M) through a first switching means (T2) with a low impedance and the emitter is connected with a supply terminal (Vcc) through a second switching means (T3) for allowing the flowing of a reverse current in the base-emitter junction, and wherein the second switching means has a low impedance as long as the base-emitter voltage ($V_{BE}$) is low, immediately after its switching on and that of the first switching means, and a higher impedance as soon as the emitter voltage approaches the supply voltage (Vcc), this transition being automatically carried out wherein said second switching means (T3) comprises:

a main switch (T5) becoming conductive when the voltage difference between its first main terminal and its control terminal is higher than a determined threshold, this first main terminal being connected with the supply terminal and the second main terminal being connected with the emitter terminal;

an auxiliary switch (T6) connected between the control terminal and the second main terminal; and a resistor (R1) connected between the control terminal and the first main terminal.

7. A base control circuit according to claim 6, wherein the main and auxiliary switches are P-channel depletion MOS transistors.

8. A base control circuit according to claim 6, wherein the main and auxiliary switches are PNP-type bipolar transistors.

9. A bridge base control circuit for a power switch having a base and an emitter, comprising a reverse current circuit means for discharging current from said power switch, said reverse current circuit means including a first switch means for connecting said base of said power switch to a reference voltage source producing a reference voltage and a second switch means for connecting said emitter of said power switch to a supply voltage source producing a supply voltage wherein the second switch means includes a series connection of a first conduction electrode of a first transistor and a current limiting resistor, said current limiting resistor being connected to said supply voltage source, and a second transistor having a first conduction electrode connected to said supply voltage source and a control electrode connected to a common node of said series connection between said first transistor and said current limiting resistor, a second conduction electrode of each of said first and second transistors being coupled to said emitter of said power switch, whereby, immediately upon turning off of said power switch, a low impedance is automatically provided in said reverse current circuit means when a voltage at said emitter of said power switch is approximately at said reference voltage and, thereafter, a higher impedance is provided in said reverse current means when the voltage at said emitter of said power switch departs from said reference voltage and approaches said supply voltage.

10. A base control circuit as recited in claim 9 wherein the first and second transistors are P-channel depletion MOS transistors.

11. A base control circuit as recited in claim 9 wherein the first and second transistors are PNP-type bipolar transistors.

12. A base control circuit according to claim 9 including a bridge leg for turning on said power switch which is of the switching current source type comprising a switch controlled by a high frequency signal.

13. A base control circuit according to claim 12 wherein said second switching means includes a P-channel field effect transistor controlled by an oscillating signal connected in series with an inductance, a first diode connected between said supply voltage source and a connection of a first terminal of said inductance and said base of said power switch, and a second diode connected between said reference voltage source and said connection between said inductance and said P-channel field effect transistor.

14. A base control circuit according to claim 9, further including inhibition means connected in series with said base of said power switch and responsive to a voltage appearing on a collector electrode of said power switch to interrupt signals for turning on said power switch.

15. A base control circuit according to claim 14 wherein said inhibition means includes time delay means for delaying interruption of said signals for turning on said power switch for a predetermined period.

* * * * *